(12) United States Patent
Chow et al.

(10) Patent No.: US 7,225,370 B2
(45) Date of Patent: May 29, 2007

(54) EYE WIDTH CHARACTERIZATION MECHANISM

(75) Inventors: Kim Kee Chow, Bayan Lepas (MY); Sunil K. Jain, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 259 days.

(21) Appl. No.: 10/930,202

(22) Filed: Aug. 31, 2004

(65) Prior Publication Data

US 2006/0048030 A1    Mar. 2, 2006

(51) Int. Cl.
G06K 5/04    (2006.01)

(52) U.S. Cl. .................................................... 714/700

(58) Field of Classification Search ................ 714/700, 714/704, 707
See application file for complete search history.

(56) References Cited

U.S. PATENT DOCUMENTS

| | | | |
|---|---|---|---|
| 5,654,987 A * | 8/1997 | Nakamura | 375/355 |
| 6,263,034 B1 * | 7/2001 | Kanack et al. | 375/371 |
| 6,990,418 B2 * | 1/2006 | Blanc et al. | 702/69 |
| 2005/0188284 A1 * | 8/2005 | Proano et al. | 714/47 |
| 2005/0259764 A1 * | 11/2005 | Hung Lai et al. | 375/317 |

\* cited by examiner

Primary Examiner—James C Kerveros
(74) Attorney, Agent, or Firm—Blakely, Sokoloff, Taylor & Zafman LLP

(57) ABSTRACT

An eye width characterization mechanism determines a pass setting of a sampling phase positioned within an eye width of received data. The sampling phase is incremented in a first direction from the pass setting until the sampling phase is outside the eye width of the received data. The sampling phase is then incremented in an opposite direction of the first direction starting again from the pass setting until the sampling phase is outside the eye width of the received data. The number of the sampling phase increments in the first direction is added to the number of the sampling phase increments in the opposite direction to characterize the eye width of the received data.

17 Claims, 5 Drawing Sheets

EYE WIDTH CHARACTERIZATION MECHANISM

TECHNICAL FIELD

This disclosure relates generally to design validation, and in particular but not exclusively, relates to a built-in mechanism to characterize an eye width of a signal.

BACKGROUND INFORMATION

The design time between product cycles is becoming increasingly compressed. As such, hardware designers have less time to thoroughly test designs to work out bugs and characterize design performance. To aggravate this design verification quandary, as new high-speed, ultra-precise technologies are developed, often test equipment does not exist that is capable of adequately or vigorously testing a design. In fact, a designer may find himself in a scenario where his prototype is faster and more precise than the test equipment at his disposal to verify operation of the prototype.

The demands of compressed product cycles may dictate that a hardware designer is not afforded the luxury of waiting while sufficiently fast, sensitive, and precise test equipment is developed. In response, hardware designers have developed self-test methodologies to aid the design verification process. One such methodology is built in self-test ("BIST"). BIST is a circuit design technique in which physical elements of a circuit are devoted to testing the circuit itself to identify various design and/or manufacturing flaws. Similarly, input/output BIST ("IBIST") is a design technique for testing input/output ("I/O") circuitry. BIST and IBIST afford the designer the opportunity to integrate test components into his design that are capable of vigorously stress testing a prototype.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of a system and method for implementing an eye width characterization mechanism are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
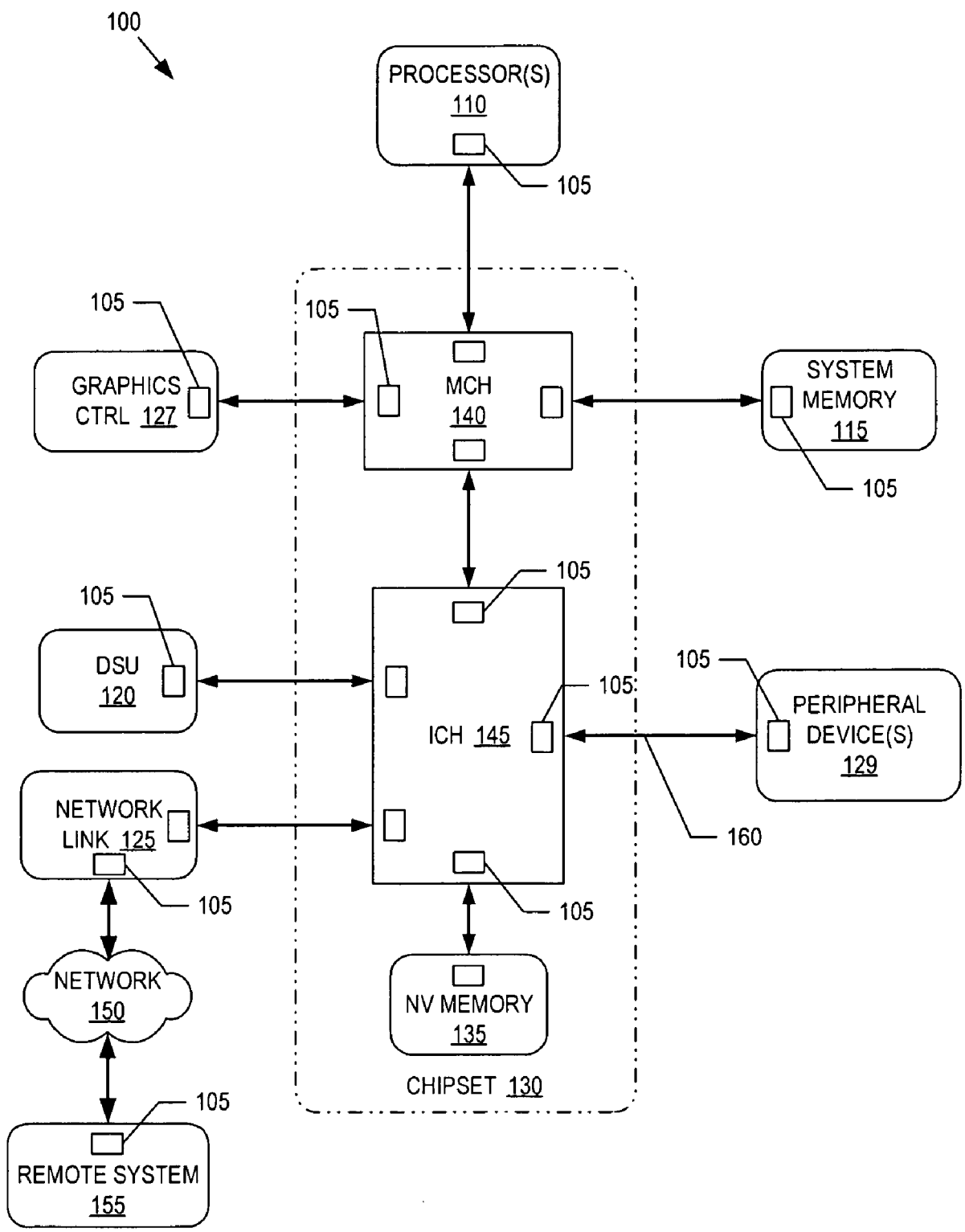
FIG. 1 is a block diagram illustrating a system including eye width characterization mechanisms, in accordance with an embodiment of the present invention.

FIG. 1 is a block diagram illustrating a processing system 100 including eye width characterization mechanisms ("EWCM") 105 (only a portion of which have been labeled), in accordance with an embodiment of the present invention. The illustrated embodiment of processing system 100 includes one or more processors (or central processing units) 110, system memory 115, a data storage unit ("DSU") 120, a network link 125, a graphics controller 127, peripheral devices 129, and a chipset 130. Chipset 130 may further include non-volatile ("NV") memory 135, a memory controller hub ("MCH") 140, and an input/output controller hub ("ICH") 145. The illustrated processing system 100 may represent any computing system including a desktop computer, a notebook computer, a workstation, a handheld computer, a server, a blade server, or the like.

The elements of processing system 100 are interconnected as follows. Processor 110 is communicatively coupled to system memory 115, NV memory 135, DSU 120, network link 125, graphics controller 127, and peripheral devices 129 via chipset 130 to send and to receive instructions or data thereto/therefrom. In one embodiment, NV memory 135 is a flash memory device. In other embodiments, NV memory 135 includes any one of read only memory ("ROM"), programmable ROM, erasable programmable ROM, electrically erasable programmable ROM, or the like. In one embodiment, system memory 115 includes random access memory ("RAM"), such as dynamic RAM ("DRAM"), synchronous DRAM, ("SDRAM"), double data rate SDRAM ("DDR SDRAM") static RAM ("SRAM"), and the like. DSU 120 represents any storage device for software data, applications, and/or operating systems, but will most typically be a nonvolatile storage device. DSU 120 may optionally include one or more of an integrated drive electronic ("IDE") hard disk, an enhanced IDE ("EIDE") hard disk, a redundant array of independent disks ("RAID"), a small computer system interface ("SCSI") hard disk, and the like. Network link 125 may couple processing system 100 to a network 150 (e.g., LAN, WAN, Internet, etc.) such that processing system 100 may communicate over network 150 with one or more remote computers 155. Network link 125 may include a modem, an Ethernet card, Universal Serial Bus ("USB") port, a wireless network interface card, or the like. Finally, peripheral devices 129 may include any number of add-on devices such as digital cameras, a mouse, a keyboard, an external DSU, and the like. Peripheral devices 129 may be coupled to chipset 130 via a high-speed interconnect bus 160. Embodiments of high-speed interconnect bus 160 may include a USB bus (e.g., USB 2.0 or higher), a Peripheral Component Interconnect ("PCI") Express bus, a Firewire bus, or other current/future developed high-speed interconnects.

It should be appreciated that various other elements of processing system 100 have been excluded from FIG. 1 and this discussion for the purposes of clarity. Correspondingly, processing system 100 may operate without one or more of the elements illustrated. Chipset 130 illustrates an Intel hub architecture chipset; however, embodiments of the present invention are equally applicable to other chipset architectures.

EWCMs 105 may be integrated into processing system 100 and remote system 155 at various locations to test the operation of interconnect buses. An EWCM 105 may be provided to test each bit line of a multi-but interconnect bus. In one embodiment, EWCMs 105 are incorporated into the receiver circuitry of each interconnect bus of which a built-in self-test capability is desired. For example, EWCMs 105 may be integrated into the receiver circuitry of high-speed interconnect bus 160 to rigorously test interconnect bus 160 and characterize an eye width of signals transmitted there over. An EWCM 105 may be incorporated into peripheral device 129 to characterize the eye width of signals received at peripheral device 129. Similarly, an EWCM 105 may be incorporated into ICH 145 to characterize the eye width of signals received at ICH 145 and transmitted from peripheral device 129. As illustrated by FIG. 1, an EWCM 105 may be provided to perform design verification ("DV") on any interconnect bus of processing system 100. In fact, an EWCM 105 may be integrated into remote system 155 to perform DV tests on network 150.

DV tests may be executed by EWCMs 105 under test software control executing on processor 110. Alternatively, EWCMs 105 may be accessed and operated via test access ports (not illustrated), or even by attachment of an In-Target Probe enabling register read/write capability. With read/write access to registers of EWCMs 105, an interconnect bus can be stimulated with test vectors under test software control and the eye width of the individual bits of the test vectors determined. These DV tests can be performed at full bus speeds to simulate regular operational environments and obtain a true eye width characterization. For high-speed interconnect buses, such as a PCI Express bus which operates at 2.5 GHz, signal jitter and inter symbol interference ("ISI") are exasperated at high frequencies. As such, to obtain precise eye width characterizations, these DV tests should be conducted under full speed, regular operation.

Figure 2:
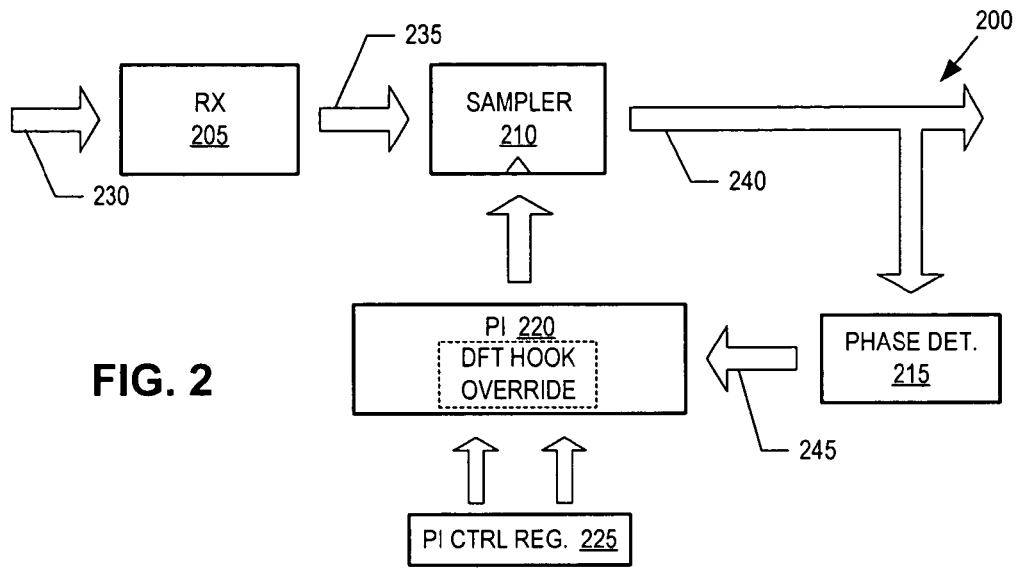
FIG. 2 is a block diagram illustrating an eye width characterization mechanism, in accordance with an embodiment of the present invention.

FIG. 2 is a block illustrating a hardware aspect of an EWCM 200, in accordance with an embodiment of the present invention. The illustrated embodiment of EWCM 200 includes a receiver 205, a sampler 210, a phase detector 215, a phase interpolator ("PI") 220, and a PI control register 225. PI 220 includes a design for test ("DFT") hook override to implement an override mechanism to preempt a normal tracking mode of PI 220 with a test mode.

Receiver 205 couples to an interconnect bus (e.g., high-speed interconnect bus 160) to receive data/test vectors therefrom. In one embodiment, the data may be transmitted in the form of symbols 230, which receiver 205 demodulates/translates into binary data for transmission to sampler 210. Sampler 210 samples received data 235 at a sampling phase determined by phase detector 215 and PI 220. Sampler 210 outputs sampled data 240 for transmission to downstream circuitry and to phase detector 215. Phase detector 215 senses a phase of the sampled data 240 and provides phase data 245 to PI 220. In one embodiment, the phase data 245 is a signal indicating a rising edge or falling edge of the sampled data 240. During normal operation, PI 220 performs a phase tracking operation applying fine granularity adjustments to phase data 245 provided by phase detector 215. For high-speed signaling circuitry, PI 220 is capable of precisely aligning the sampling phase of sampler 210 at an optimal position of an eye width (e.g., center) of received data 235.

PI 220 includes the DFT hook override to preempt the regular tracking mode of PI 220 and switch PI 220 into a test mode capable of characterizing the eye width of received data 235 (and therefore characterize the high-speed interconnect bus coupled to receiver 205). The test mode may be triggered in response to control data written into PI control register 225. Once operating within the test mode, PI 220 is controllable via PI control register 225. During the test mode, the fine granularity phase adjustments applied to phase data 245 can be selectively increment in both a clockwise or counter clockwise direction under control of PI control register 225. As such, PI control register 225 can selectively increment the sampling phase of sampler 210 in a clockwise or counter clockwise direction.

Figure 4:
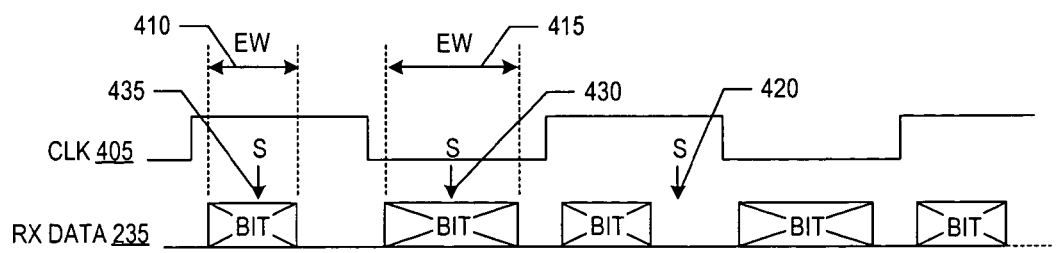
FIG. 4 is a timing diagram illustrating the eye width of received data and various sampling phase settings, in accordance with an embodiment of the present invention.

Referring to FIG. 4, received data 235 may arrive phase delayed (or early) with respect to a clock signal 405 extracted from the sampled data 240 by phase detector 215. As such, if sampler 210 were to sample received data 235 at the rising edge or falling edge of clock signal 405, received data 235 would not be validly sampled, since the sampling phase would fall outside of the eye width (e.g., eye width 410 or 415) of received data 235. Accordingly, PI 220 can apply a phase adjustment in either direction (e.g., clockwise or counter clockwise) to reposition an invalid sampling phase (e.g., invalid sampling phase 420) inside the eye widths 410 and 415 (e.g., valid sampling phases 430 and 435).

Figure 3:
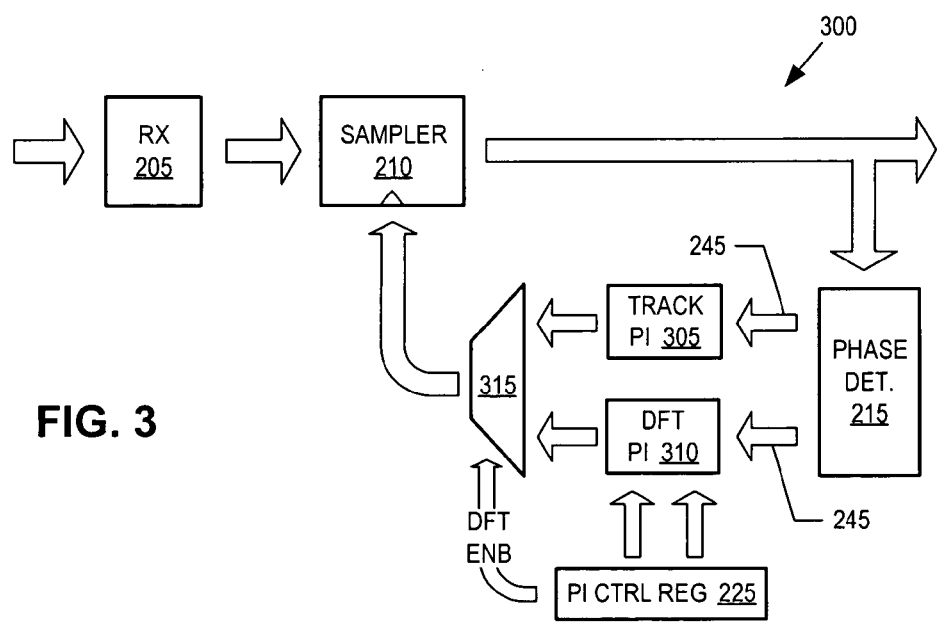
FIG. 3 is a block diagram illustrating an eye width characterization mechanism, in accordance with an embodiment of the present invention.

FIG. 3 is a block illustrating a hardware aspect of an EWCM 300, in accordance with an embodiment of the present invention. EWCM 300 is similar to EWCM 200 with the following exceptions. Instead of providing a DFT hook override within a single PI 220 capable of dual mode operation (regular tracking mode and test mode), EWCM 300 includes a tracking PI 305 and a DFT PI 310 coupled to receive phase data 245 from phase detector 215. During the regular tracking mode, PI control register 225 sets multiplexer 315 to select the output of tracking PI 305 to control the sampling phase of sampler 210. During the test mode, PI control register 225 sets multiplexer 315 to select the output of DFT PI 310 to control the sampling phase of sampler 210. During the test mode, PI control register 225 can control DFT PI 310 to selectively increment the sampling phase in a clockwise or a counter clockwise direction, as described above in connection with PI 220.

The processes explained below are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like. The order in which some or all of the process blocks appear in each process should not be deemed limiting. Rather, one of ordinary skill in the art having the benefit of the present disclosure will understand that some of the process blocks may be executed in a variety of orders not illustrated.

Figure 5A:
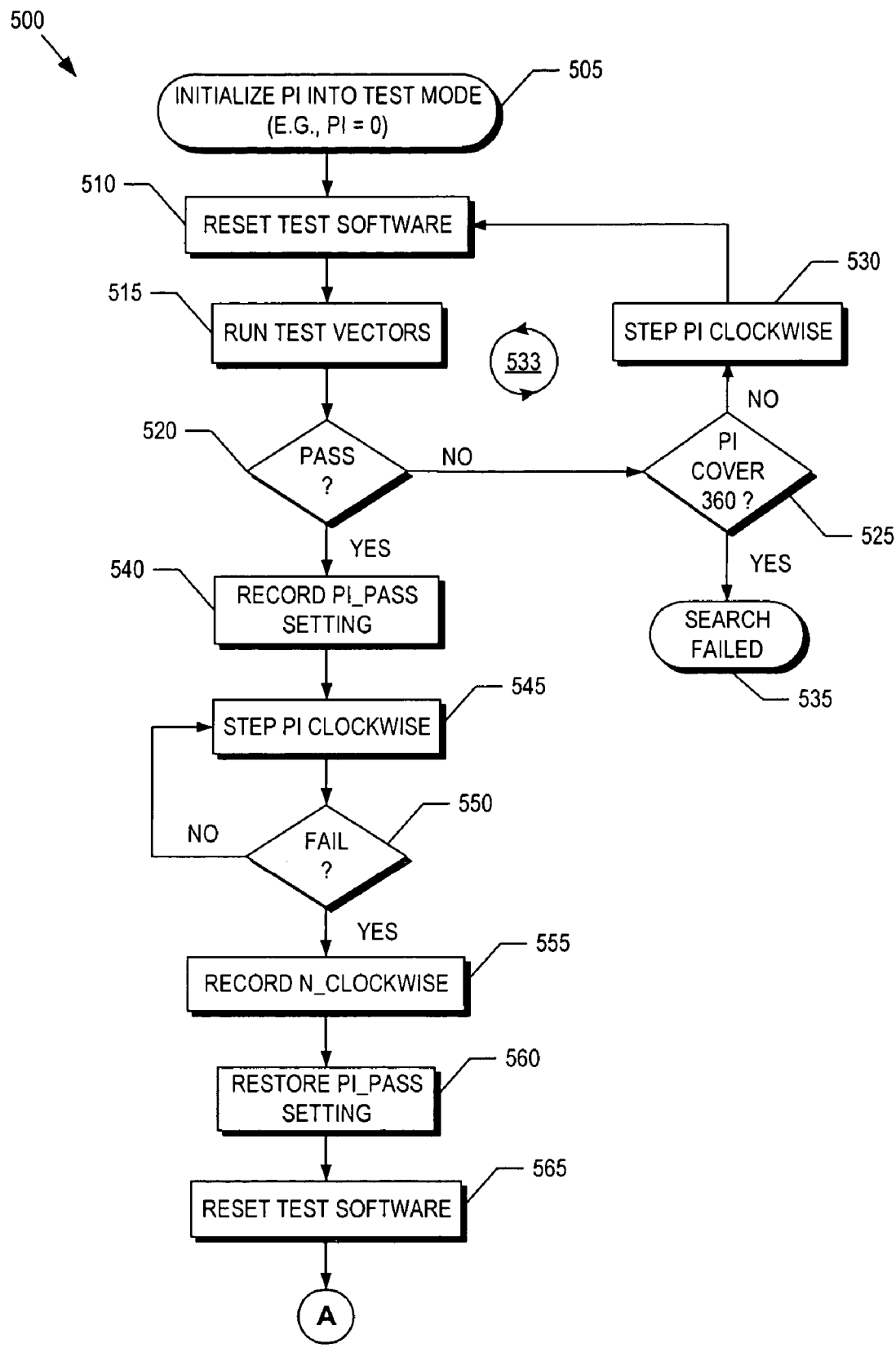
FIG. 5A is a flow chart illustrating a process for characterizing an eye width of received data, in accordance with an embodiment of the present invention.

FIG. 5A is a flow chart illustrating a process 500 for characterizing an eye width of received data 235, in accordance with an embodiment of the present invention. Process 500 will be described in connection with EWCM 200, but it should be appreciated that process 500 is equally applicable to embodiments of EWCM 300.

In a process block 505, control data is written to PI control register 225 causing the DFT hook override to place PI 220 into the test mode. Placing PI 220 in the test mode enables PI controlr register 225 to take over control of PI 220, thereby preempting the regular tracking mode. Once control of PI 220 is given to PI control register 225, PI 220 is set to an initial setting.

Figure 6:
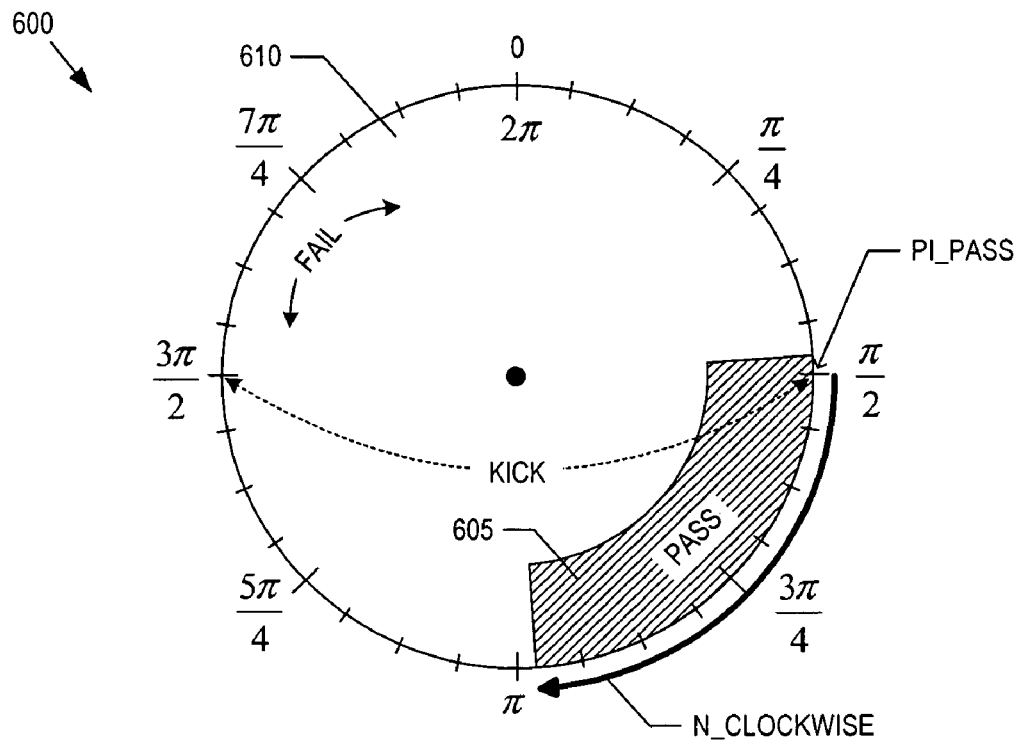
FIG. 6 is a phase diagram illustrating passing and failing sampling phase regions, in accordance with an embodiment of the present invention.

For example, an initial setting may include applying zero phase delay to the sampling phase of sampler 210. FIG. 6 illustrates a phase circle 600 having a passing region 605 and a failing region 610. FIG. 6 is provided to help explicate process 500 by way of example and not limitation. Passing region 605 corresponds to those sampling phases falling within eye width 410 and therefore validly sampling received data 235. Applying an initial setting of zero phase delay would position the sampling phase at the top of phase circle 600 at zero radians, outside passing region 605. Other initial sampling phases may be used.

In a process block 510, test software for generating test vectors (e.g., received data 235) to transmit across an interconnect bus coupled to receiver 205 may be reset. Resetting the test software may simply include initializing or launching the test software application. Once the test software is ready, the test vectors are generated. The test vectors may be generated by the test software executing on processor 110 (see FIG. 1) or may be generated by an external test system communicatively coupled to stimulate the particular interconnect bus for DV purposes. In one embodiment where the interconnect bus under test is a PCI Express interconnect bus, executing the test software causes processing system 100 to enter a Compliance Measurement Mode ("CMM") of operation.

In a decision block 520, if sampler 210 validly samples received data 235, then process 500 continues to a process block 540. Otherwise, process 500 continues to a decision block 525. Received data 235 is not validly sampled when the sampling phase, controlled by PI 220, falls outside the eye width 410. Referring to phase circle 600, a sampling phase falling outside of passing region 605 would result in a failed sampling of received data 235. Since the initial sampling phase is zero radians, the sampling phase is outside passing region 605.

In decision block 525, the test software determines whether a full 360 degrees (or $2\pi$ radians) of phase circle 600 has been traversed in an attempt to locate passing region 605. If a full 360 degrees has not been traversed, then process 500 continues to a process block 530. In process block 530, the sampling phase of sampler 210 is incremented one unit in the clockwise direction under the control of PI 220. In one embodiment, PI 220 is capable of incrementing the sampling phase of sampler 210 in step sizes of $\pi/16$ radians. In this embodiment, phase circle 600 is separated into thirty-two discrete phase increments. Other increment sizes are possible depending upon the resolution desired to characterize eye width 410. Once the sampling phase is incremented one step, process 600 returns to process block 510 and continues therefrom as described above. Process 500 continues to loop around loop 533 until sampler 210 validly samples received data 235 (e.g., the sampling phase moves into passing region 605) or until a full 360 degrees of phase circle 600 has been traversed. If the sampling phase traverses phase circle 600 without validly sampling received data 235 at least once, then process 500 continues to a process block 535. In process block 535, a "search failed" error is issued and/or logged. The search failed error may indicate that zero eye width is found. A zero eye width could indicate the particular interconnect bus is faulty.

Returning to decision block 520, once sampler 210 validly samples received data 235, process 500 continues to process block 540. In the example of FIG. 6, sampler 210 would first validly sample received data 235 at a sampling phase of $\pi/2$ radians (or 45 degrees). In process block 540, the setting of PI 220 when sampler 210 first validly samples received data 235 is recorded and saved for future use as a PI_PASS variable. In the example of FIG. 6, PI_PASS=$\pi/2$ radians. Alternatively, instead of a phase, PI_PASS may record the number of clockwise increments from the initial setting of PI 220. In this case, PI_PASS=8 clockwise increments.

In a process block 545, PI 220 again increments the sampling phase of sampler 210 in a clockwise direction. PI 220 continues to increment the sampling phase to traverse passing region 605 until sampler 210 fails to validly sample received data 235 once again (decision block 550). In other words, PI 220 continues to increment the sampling phase in the clockwise direction until the sampling phase falls outside of eye width 410. Referring to the example of FIG. 6, sampler 210 would fail to validly sample received data 235 when the sampling phase reaches $\pi$ radians (or 16 increments in the clockwise direction from the initial setting).

In a process block 555, the number of clockwise increments that correspond to valid sampling settings is recorded for future use as a variable N_CLOCKWISE. In the example of FIG. 6, N_CLOCKWISE would be equal to the number of clockwise increments falling within passing region 605 (i.e., N_CLOCKWISE=7). At this point, the number of clockwise increments falling within eye width 410 has been determined. Referring to FIG. 4, eye widths 410 and 415 have been illustrated having differing widths. The ISI resulting from high-speed switching can often causes alternating bits to have different eye widths. Accordingly, in one embodiment, the test vectors run at process block 515 may include two or more consecutive bits of received data 235. Do so ensures that the overall eye width of a particular interconnect bus is determined to be the smaller of eye width 410 and eye width 415 to provide a conservative eye width characterization.

In a process block 560, the sampling phase is restored back to the PI_PASS setting (i.e., the sampling phase when received data 235 was first validly sampled). Restoring the sampling phase to the PI_PASS setting restores PI 220 back to a setting that caused sampler 210 to have a sampling phase equal to PI_PASS. In the example of FIG. 6, the sampling phase would be restored to $\pi/2$ (or 8 clockwise increments from the initial setting of zero). Subsequently, the test software generating the received data 235 (e.g., test vectors) may be reset after invalidly sampling received data 235 (e.g., at $\pi$ radians). Resetting the test software may or may not be necessary depending upon whether the test software is capable of recovering after received data 235 is invalidly sampled or the sampling phase has passed outside of the eye width.

Figure 5B:
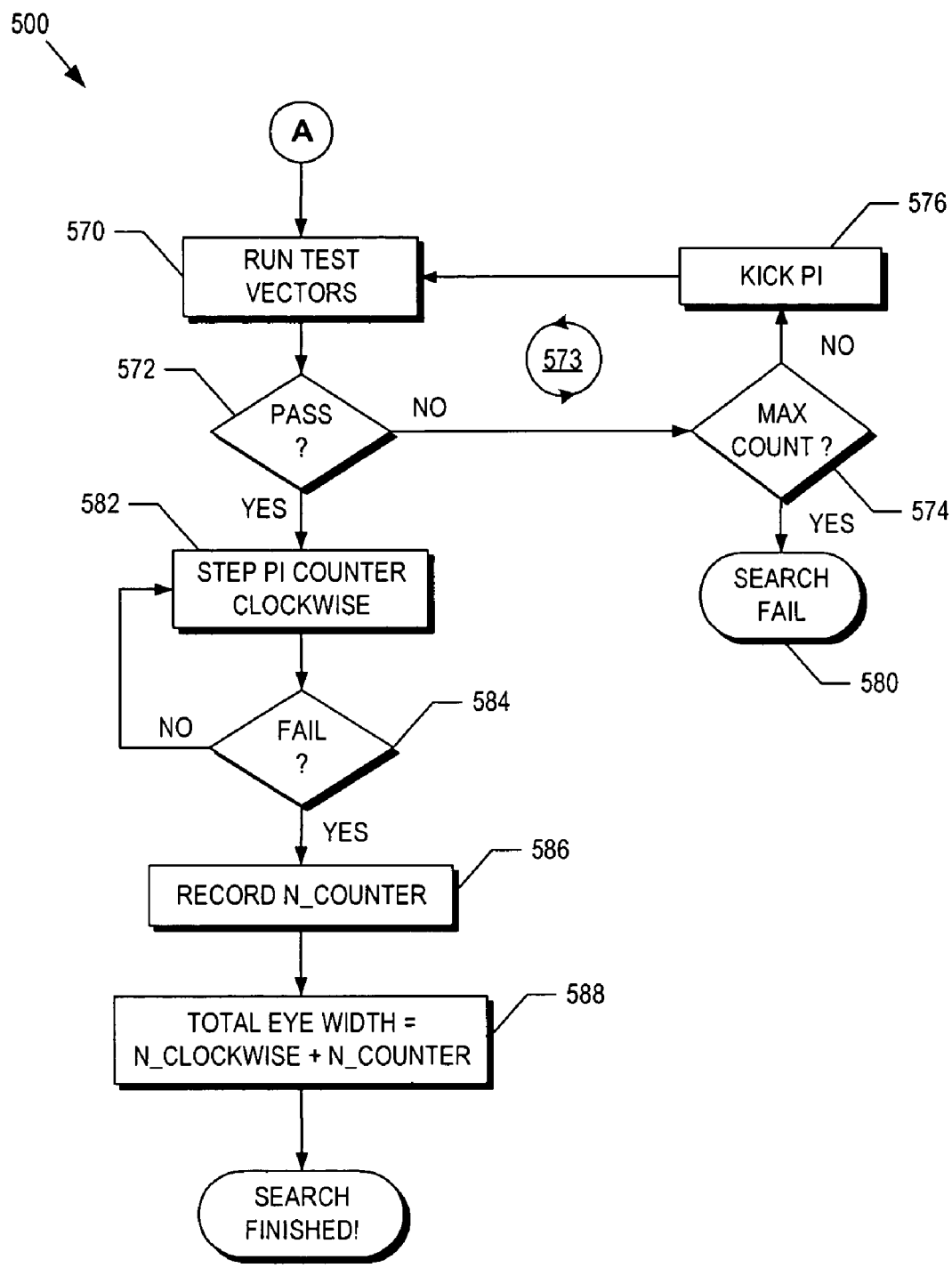
FIG. 5B is a flow chart illustrating a continuation of a process for characterizing an eye width of received data, in accordance with an embodiment of the present invention.

Process 500 continues from process block 565 onto FIG. 5B to a process block 570. In process block 570, the test software again stimulates receiver 205 with test vectors (i.e., received data 235) transmitted over the particular interconnect bus coupled to receiver 205. In a decision block 572, the test software determines whether the test vectors were validly sampled. If the test vectors were validly sampled, then the sampling phase was correctly restored to the PI_PASS setting. However, due to the inherent nature of PI 220, after the restoring the PI_PASS setting of PI 220 and resetting the test software, the sampling phase may be restored 180 degrees out of phase (i.e., PI_PASS+π radians). Referring to the example of FIG. 6, the sampling phase may restore to 3π/2 radians, instead of π/2 radians.

If the sampling phase is restored 180 degrees out of phase, then the sampling phase will fall outside of the passing region 605. In this scenario, process 500 continues to a decision block 574 from decision block 572. If process 500 has not passed around loop 573 more than a maximum count (e.g., $10^{15}$ times), then the sampling phase is "kicked" a 180 degrees, in a process block 576. The sampling phase is kicked a 180 degrees by adjusting the phase delay imparted by PI 220 to phase data 245 by a 180 degrees.

Once the sampling phase has been kicked by 180 degrees, process 500 returns to process block 570 and continues therefrom as described above. Kicking the sampling phase 180 degrees should position the sampling phase back at the PI_PASS setting within passing region 605. However, in the example of FIG. 6, the PI_PASS setting resides close to the boundary of passing region 605. When testing high-speed interconnect buses, signal jitter and ISI may result in a sampling phase of π/2 radians validly sampling received data 235 one pass through loop 573, while failing another pass through loop 573. Accordingly, process 500 will cycle through loop 573 a predetermined number of times (e.g., $10^{15}$ times) before issuing a "search failed" indication in process block 580. In one embodiment, process 500 may require several valid samplings at the PI_PASS setting before continuing from decision block 572 to a process block 582.

Once the PI_PASS setting has been restored and determined valid, process 500 continues to process block 582. In process block 582, PI 220 begins incrementing the sampling phase in a counter clockwise direction from the PI_PASS setting. PI 220 continues to increment the sampling phase in the counter clockwise direction until the sampling phase falls outside of the passing region. In the example of FIG. 6, a single increment in the counter clockwise direction would result in an immediate sampling error, since PI_PASS falls on the counter clockwise most boundary of passing region 605.

Figure 7:
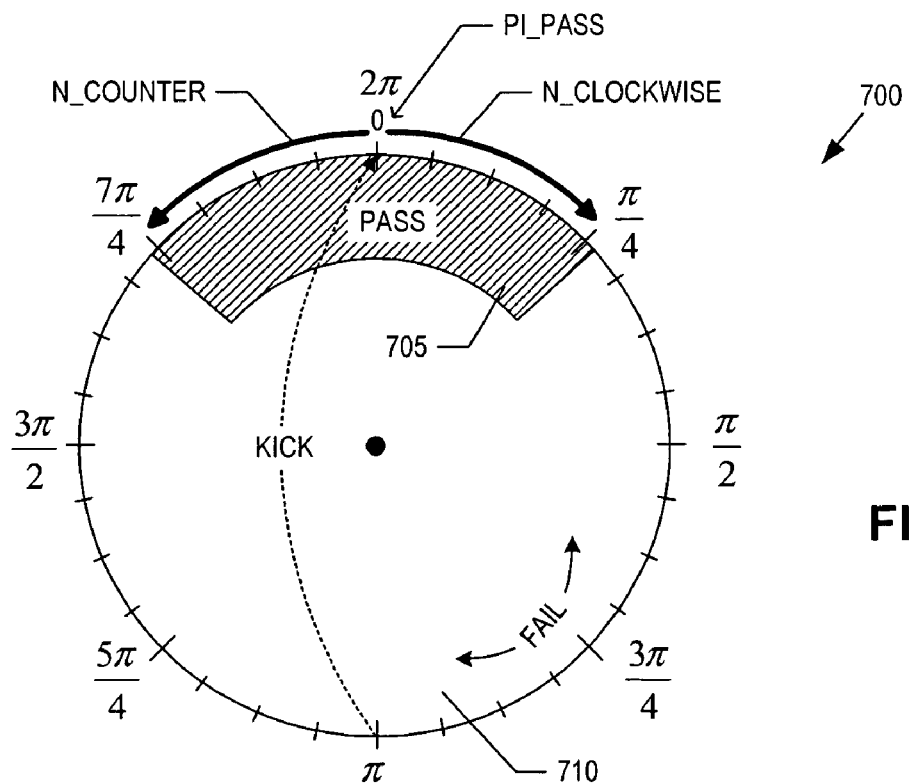
FIG. 7 is a phase diagram illustrating passing and failing sampling phase regions, in accordance with an embodiment of the present invention.

FIG. 7 illustrates a phase circle 700 having a passing region 705 and a failing region 710. FIG. 7 is provided to help explicate process 500 by way of example and not limitation. In the example of FIG. 7, the initial setting (PI=0) falls within passing region 705, and therefore received data 235 will be validly sampled on the first try at process block 520. As such, the PI_PASS setting will equal the initial setting of zero phase delay. FIG. 700 illustrates N_CLOCKWISE of passing region 705 equal to π/4 or 4 increments in the clockwise direction.

Returning to process block 582 and decision block 584, PI 220 will increment the sampling phase in the counter clockwise direction for 4 increments at which point the sampling phase falls outside of passing region 705. In a process block 586, the variable N_COUNTER is set to the number of counter clockwise increments (e.g., π/4 radians counter clockwise). In a process block 588, the eye width of received data 235 (e.g., total width of passing region 605 or 705) is determined by adding N_CLOCKWISE plus N_COUNTER. In the example of FIG. 6, the eye width equals 7+0=7 increments or 7π/16 radians. In the example of FIG. 7, the eye width equals 4+4=8 increments or π/2 radians.

EWCMs 105 provide a sort of Built in Design Validation ("BiDV") technique. BiDV is a circuit design and usage technique in which physical elements of a circuit are devoted to testing and characterizing the circuit itself to identify various design, performance, and/or manufacturing flaws. BiDV may be used in conjunction with Built in Self Test ("BIST") and input/output BIST ("IBIST") to provide a complete suite of fully integrated test and characterization tools. BiDV, BIST, and IBIST all afford the designer of a circuit the opportunity to integrate sufficiently fast and precise test components into a design capable of vigorously stress testing a prototype at operational speed and with the precision necessary to characterize and validate newly developed, high-speed designs.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
   determining a pass setting of a sampling phase positioned within an eye width of received data;
   incrementing the sampling phase in a first direction from the pass setting until the sampling phase is outside the eye width of the received data;
   incrementing the sampling phase in an opposite direction of the first direction from the pass setting until the sampling phase is outside the eye width of the received data; and
   summing a first number of the sampling phase increments in the first direction with a second number of the sampling phase increments in the opposite direction to characterize the eye width of the received data.

2. The method of claim 1, wherein determining the pass setting of the sampling phase positioned within the eye width of the received data comprises:
   setting the sampling phase to an initial setting;
   sampling the received data at the initial setting; and
   incrementing the sampling phase in the first direction until the received data is validly sampled, the pass setting of the sampling phase being set when the received data is validly sampled.

3. The method of claim 2, wherein determining the pass setting of the sampling phase positioned within the eye width of the received data further comprises generating a first search failed indication if incrementing the sampling phase in the first direction sweeps out 360 degrees without validly sampling the received data.

4. The method of claim 3, wherein the received data comprises test vectors and further comprising:
   restoring the sampling phase to the pass setting;

resetting the test vectors between incrementing the sampling phase in the first direction and incrementing the sampling phase in the opposite direction; and kicking the sampling phase 180 degrees after resetting the test vectors, if the received data is not validly sampled.

5. The method of claim 4, further comprising generating a second search failed indication if the received data is not validly sampled after kicking the sampling phase 180 degrees a predetermined number of times.

6. The method of claim 1, wherein the received data comprises test vectors communicated over an interconnect bus at a regular operational speed of the interconnect bus.

7. The method of claim 6, wherein incrementing the sampling phase in the first direction comprises adjusting a phase delay of a phase interpolator in the first direction and wherein incrementing the sampling phase in the opposite direction comprises adjusting the phase delay of the phase interpolator in the opposite direction.

8. The method of claim 7, wherein adjusting the phase delay of the phase interpolator in the first direction and the opposite direction comprises preempting a normal tracking mode of the phase interpolator with a test mode by updating control data of a phase interpolator control register.

9. The method of claim 7, wherein adjusting the phase delay of the phase interpolator in the first direction and the opposite direction comprises:

setting a multiplexer to select a design for test ("DTF") phase interpolator to control the sampling phase of a sampler; and updating control data of a phase interpolator control register to indicate to the DFT phase interpolator to adjust the phase delay in one of the first direction and the opposite direction.

10. The method of claim 1, wherein the increments in the first direction and the increments in the opposite direction comprise fixed sized phase increments.

11. The method of claim 10, wherein the first direction comprises a clockwise direction and the opposite direction comprises a counter clockwise direction.

12. A machine-accessible medium that provides instructions that, if executed by a machine, will cause the machine to perform operations comprising:

determining a pass setting of a sampling phase positioned to validly sample received data;

incrementing the sampling phase in a first direction from the pass setting until the sampling phase is no longer positioned to validly sample the received data;

incrementing the sampling phase in an opposite direction of the first direction from the pass setting until the sampling phase is no longer positioned to validly sample the received data; and summing a first number of the sampling phase increments in the first direction with a second number of the sampling phase increments in the opposite direction to determine an eye width of the received data.

13. The machine-accessible medium of claim 12, wherein determining the pass setting of the sampling phase comprises:

setting the sampling phase to an initial setting;

sampling the received data at the initial setting; and incrementing the sampling phase in the first direction until the received data is validly sampled.

14. The machine-accessible medium of claim 13, wherein determining the pass setting of the sampling phase further comprises generating a first search failed indication if incrementing the sampling phase in the first direction sweeps out 360 degrees without validly sampling the received data.

15. The machine-accessible medium of claim 14, wherein the received data comprises test vectors and further comprising:

restoring the sampling phase to the pass setting after incrementing the sampling phase in the first direction until the sampling phase is no longer positioned to validly sample the received data;

resetting the test vectors between incrementing the sampling phase in the first direction and incrementing the sampling phase in the opposite direction; and kicking the sampling phase 180 degrees after resetting the test vectors, if the received data is not validly sampled.

16. The machine-accessible medium of claim 12, wherein the received data comprises test vectors communicated over an interconnect bus at a regular operational speed of the interconnect bus.

17. The machine-accessible medium of claim 12, wherein incrementing the sampling phase in the first direction comprises adjusting a phase delay of a phase interpolator in the first direction and wherein incrementing the sampling phase in the opposite direction comprises adjusting the phase delay of the phase interpolator in the opposite direction.

* * * * *